(12) United States Patent
Frish et al.

(10) Patent No.: US 12,405,133 B2
(45) Date of Patent: Sep. 2, 2025

(54) MAGNETIC INDOOR POSITIONING WITH MAGNETOMETER CALIBRATION ERRORS EQUALIZATION

(71) Applicant: ORIIENT NEW MEDIA LTD., Tel Aviv (IL)

(72) Inventors: Amiram Frish, Giv'atayim (IL); Imri Enosh, Rehovot (IL)

(73) Assignee: Oriient New Media Ltd, Tel-Aviv (IL)

( * ) Notice: Subject to any disclaimer, the term of this patent is extended or adjusted under 35 U.S.C. 154(b) by 0 days.

(21) Appl. No.: 17/922,801

(22) PCT Filed: Sep. 29, 2021

(86) PCT No.: PCT/IB2021/056927
§ 371 (c)(1),
(2) Date: Nov. 2, 2022

(87) PCT Pub. No.: WO2021/245640
PCT Pub. Date: Dec. 9, 2021

(65) Prior Publication Data
US 2023/0070440 A1  Mar. 9, 2023

Related U.S. Application Data

(60) Provisional application No. 63/032,672, filed on Jul. 29, 2021.

(51) Int. Cl.
*G01D 5/14* (2006.01)
*G01D 18/00* (2006.01)

(52) U.S. Cl.
CPC ............. *G01D 5/14* (2013.01); *G01D 18/00* (2013.01)

(58) Field of Classification Search
CPC .................. G01D 5/14; G01D 18/00
See application file for complete search history.

(56) References Cited

U.S. PATENT DOCUMENTS 9,439,041 B2 *  9/2016  Parvizi .................. H04W 4/029
10,823,573 B1  11/2020  Huberman et al.
(Continued)

FOREIGN PATENT DOCUMENTS

EP     2669627 A1    3/2016
WO  2019020945 A1    1/2019

OTHER PUBLICATIONS

International Search Report.
International Written Opinion.

*Primary Examiner* — Walter L Lindsay, Jr.
*Assistant Examiner* — Milton Gonzalez

(57) ABSTRACT

Methods and systems estimate calibration errors of magnetic sensor measurements collected at mobile devices. Each measurement is associated with a location of one of the mobile devices and has a calibration error. Data from the sensor measurements is partitioned into sets. Each set is associated with a respective calibration error associated with the measurements that generated the data in the set. Pairs of data items are identified, where each pair includes a data item from a first of the sets corresponding to a measurement, associated with a first location, that generated the data in the first set, and a data item from a second of the sets corresponding to a measurement, associated with a second location that is approximately the same as the first location, that generated the data in the first set. The calibration error associated with each of the sets is estimated based in part on the pairs.

20 Claims, 5 Drawing Sheets

(56) References Cited

U.S. PATENT DOCUMENTS

2011/0248704 A1 10/2011 Chowdhary et al.
2013/0162481 A1* 6/2013 Parvizi ................ G01S 5/02524
  342/452
2018/0180683 A1* 6/2018 Tarlow ................... G01R 33/02

* cited by examiner

MAGNETIC INDOOR POSITIONING WITH MAGNETOMETER CALIBRATION ERRORS EQUALIZATION

CROSS-REFERENCE TO RELATED APPLICATIONS

This application claims priority from U.S. Provisional Patent Application No. 63/032,672, filed May 31, 2020, whose disclosure is incorporated by reference in its entirety herein.

TECHNICAL FIELD

The present invention relates to indoor positioning systems, and in particular mapping of an indoor environment using magnetic sensor measurements.

BACKGROUND OF THE INVENTION

Mobile devices provide users with a variety of services. One such service is navigation. Navigation in outdoor environments can take advantage of a variety of inputs and sensors, for example global positioning system (GPS) related inputs and sensors. Navigation in GPS-denied or GPS-inaccurate areas requires new methods and systems to navigate, track, and position mobile devices, for example indoors, underground, dense urban streets with high buildings, natural canyons, and similar environments.

A typical modern Indoor Positioning System (IPS) relies on a mapping process which associates sensors measurements in a location (location fingerprint) to coordinates of an indoor map. An IPS may use various mobile device sensors measurements, such as received signal strength indication (RSSI) from transceiver beacons (e.g., wireless LAN modules) or magnetic measurements, to perform the mapping process. These types of sensor measurements are environmental measurements that sense the environment in the locations in which a mobile device has traversed, and the map that is created may be referred to as the fingerprint map and is used for positioning by matching new device sensor measurements to the fingerprint map. Some IPSs also update the fingerprint map while positioning in a process known as Simultaneous localization and Mapping (SLAM). In some IPSs, the map is not a fingerprint map but rather some feature map that is either derived directly from the sensor measurements or by performing some additional operations on the fingerprint map.

In IPS based on magnetic sensor measurements (referred to as magnetic IPS), certain types of measurement errors may arise from imperfections in the calibration of the magnetic sensors (magnetometers). Magnetometers generally perform sensor measurements by sensing the magnetic field of the Earth. However, these sensor measurements are typically distorted by the soft iron effect and the hard iron effect. The soft iron is caused by ferromagnetic objects (any object attracted by a magnet), and changes the direction of an existing magnetic field (such as the Earth magnetic field) depending on the orientation the ferromagnetic objects. The hard iron effect is cause by any magnet (either natural or electric) which generates its own magnetic field that is added to the Earth magnetic field. Due to the soft iron and hard iron effects, a magnetometer needs to periodically undergo a calibration process in order to estimate and cancel the soft and hard iron effects. However, known magnetometer calibration processes have imperfections themselves, including typically requiring human intervention by actively rotating the device carrying the magnetometer (e.g., mobile device) around various rotational axes. The quality of the calibration largely depends on the quality and accuracy of the sensor, the amount of motion of the device during calibration, and the quality of the calibration process. Practically, even after a device undergoes calibration processing, there are always some non-negligible residual calibration errors which may affect the quality of the IPS mapping process. Furthermore, since the mapping process may be performed using multiple mobile devices each having undergone a different magnetometer calibration process, different magnetic sensor measurements may be associated with exactly the same location on a magnetic fingerprint map. Similarly, a device that compares a magnetic sensor measurement to a fingerprint map may have a different magnetic sensor measurement at the same location.

To exacerbate matters, generating and updating a fingerprint map almost always includes location association errors, in which a sensor measurement performed at a given location on a map is incorrectly associated with a different map location.

SUMMARY OF THE INVENTION

The present invention is directed to methods and systems for equalizing calibration errors in magnetic sensor measurements.

Embodiments of the present disclosure are directed to a method that comprises: partitioning data from a plurality of magnetic sensor measurements collected at one or more mobile devices into a plurality of partitioned sets of data, each of the magnetic sensor measurements associated with a location of one of the mobile devices and having an associated calibration error, the partitioning such that each partitioned set is associated with a respective calibration error associated with the magnetic sensor measurements used to generate the data in the partitioned set; identifying one or more pairs of data items, each pair including: a data item from a first of the partitioned sets corresponding to a magnetic sensor measurement, associated with a first location, used to generate the data in the first partitioned set, and a data item from a second of the partitioned sets corresponding to a magnetic sensor measurement, associated with a second location that is substantially the same as the first location, used to generate the data in the first partitioned set; and estimating the calibration error associated with each of the partitioned sets based in part on the one or more pairs.

Optionally, the method further comprises: for each partitioned set of the partitioned sets, modifying the data in the partitioned set based on the estimated calibration error associated with the partitioned set.

Optionally, the method further comprises: associating the magnetic sensor measurements with locations in a map reference frame.

Optionally, for each pair, the second location is substantially the same as the first location if the first and second locations are within a certain distance from each other.

Optionally, for each pair, the first and second locations are magnetic feature locations, and the second location is substantially the same as the first location if the magnetic feature locations are within a certain distance from each other.

Optionally, for each pair, the first and second locations are fingerprint locations.

Optionally, for each pair, the first and second locations are magnetic fingerprint locations.

Optionally, the partitioning is performed based on at least one of: orientation of the one or more mobile devices, or the mobile devices at which the magnetic sensor measurements are collected.

Optionally, the data generated from the plurality of magnetic sensor measurements includes fingerprint location data that associates the magnetic sensor measurements to coordinates of an indoor map.

Optionally, the data generated from the plurality of magnetic sensor measurements includes magnetic feature data derived from the magnetic sensor measurements.

Optionally, the estimation is performed by minimizing a cost function that is a function of the magnetic sensor measurements associated with the data pairs.

Optionally, the one or more mobile devices includes exactly one mobile device, and the magnetic sensor measurements are collected at the exactly one mobile device at a plurality of different orientations.

Optionally, the one or more mobile devices includes at least first and second mobile devices, and at least some of the magnetic sensor measurements are collected at the first mobile device and at least some of the magnetic sensor measurements are collected at the second mobile device.

Embodiments of the present disclosure are directed to a system that comprises: a processing subsystem associated with one or more mobile devices including at least one processor in communication with a memory, the processing subsystem configured to: partition data from a plurality of magnetic sensor measurements collected at one or more mobile devices into a plurality of partitioned sets of data, each of the magnetic sensor measurements associated with a location of one of the mobile devices and having an associated calibration error, the partitioning such that each partitioned set is associated with a respective calibration error associated with the magnetic sensor measurements used to generate the data in the partitioned set, identify one or more pairs of data items, each pair including: a data item from a first of the partitioned sets corresponding to a magnetic sensor measurement, associated with a first location, used to generate the data in the first partitioned set, and a data item from a second of the partitioned sets corresponding to a magnetic sensor measurement, associated with a second location that is substantially the same as the first location, used to generate the data in the first partitioned set; and estimate the calibration error associated with each of the partitioned sets based in part on the one or more pairs.

Optionally, the processing subsystem is further configured to: for each partitioned set of the partitioned sets, modify the data in the partitioned set based on the estimated calibration error associated with the partitioned set.

Optionally, the system further comprises: one or more magnetic sensors carried by the one or more mobile devices for collecting the magnetic sensor measurements, and the processing subsystem is further configured to associate the magnetic sensor measurements with locations in a map reference frame.

Optionally, for each pair, the second location is substantially the same as the first location if the first and second locations are within a certain distance from each other.

Optionally, for each pair, the first and second locations are magnetic feature locations, and the second location is substantially the same as the first location if the magnetic feature locations are within a certain distance from each other.

Optionally, for each pair, the first and second locations are fingerprint locations.

Optionally, for each pair, the first and second locations are magnetic fingerprint locations.

Optionally, the processing subsystem configured to partition the data based on at least one of: orientation of the one or more mobile devices, or the mobile devices at which the magnetic sensor measurements are collected.

Optionally, the data generated from the plurality of magnetic sensor measurements includes fingerprint location data that associates the magnetic sensor measurements to coordinates of an indoor map.

Optionally, the data generated from the plurality of magnetic sensor measurements includes magnetic feature data derived from the magnetic sensor measurements.

Optionally, the processing subsystem is configured to estimate the calibration error associated with each of the partitioned sets by minimizing a cost function that is a function of the magnetic sensor measurements associated with the data pairs.

Optionally, the one or more mobile devices includes exactly one mobile device, and the magnetic sensor measurements are collected at the exactly one mobile device at a plurality of different orientations.

Optionally, the one or more mobile devices includes at least first and second mobile devices, and at least some of the magnetic sensor measurements are collected at the first mobile device and at least some of the magnetic sensor measurements are collected at the second mobile device.

Embodiments of the present disclosure are directed to a computer usable non-transitory storage medium having a computer program embodied thereon for causing a suitable programmed system to estimate calibration errors associated with magnetic sensor measurements, by performing the following steps when such program is executed on the system. The steps comprise: partitioning data from a plurality of magnetic sensor measurements collected at one or more mobile devices into a plurality of partitioned sets of data, each of the magnetic sensor measurements associated with a location of one of the mobile devices and having an associated calibration error, the partitioning such that each partitioned set is associated with a respective calibration error associated with the magnetic sensor measurements used to generate the data in the partitioned set; identifying one or more pairs of data items, each pair including: a data item from a first of the partitioned sets corresponding to a magnetic sensor measurement, associated with a first location, used to generate the data in the first partitioned set, and a data item from a second of the partitioned sets corresponding to a magnetic sensor measurement, associated with a second location that is substantially the same as the first location, used to generate the data in the first partitioned set; and estimating the calibration error associated with each of the partitioned sets based in part on the one or more pairs.

Unless otherwise defined herein, all technical and/or scientific terms used herein have the same meaning as commonly understood by one of ordinary skill in the art to which the invention pertains. Although methods and materials similar or equivalent to those described herein may be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

BRIEF DESCRIPTION OF THE DRAWINGS

Some embodiments of the present invention are herein described, by way of example only, with reference to the accompanying drawings. With specific reference to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

Attention is now directed to the drawings, where like reference numerals or characters indicate corresponding or like components. In the drawings.

DESCRIPTION OF THE PREFERRED EMBODIMENTS

Figure 1:
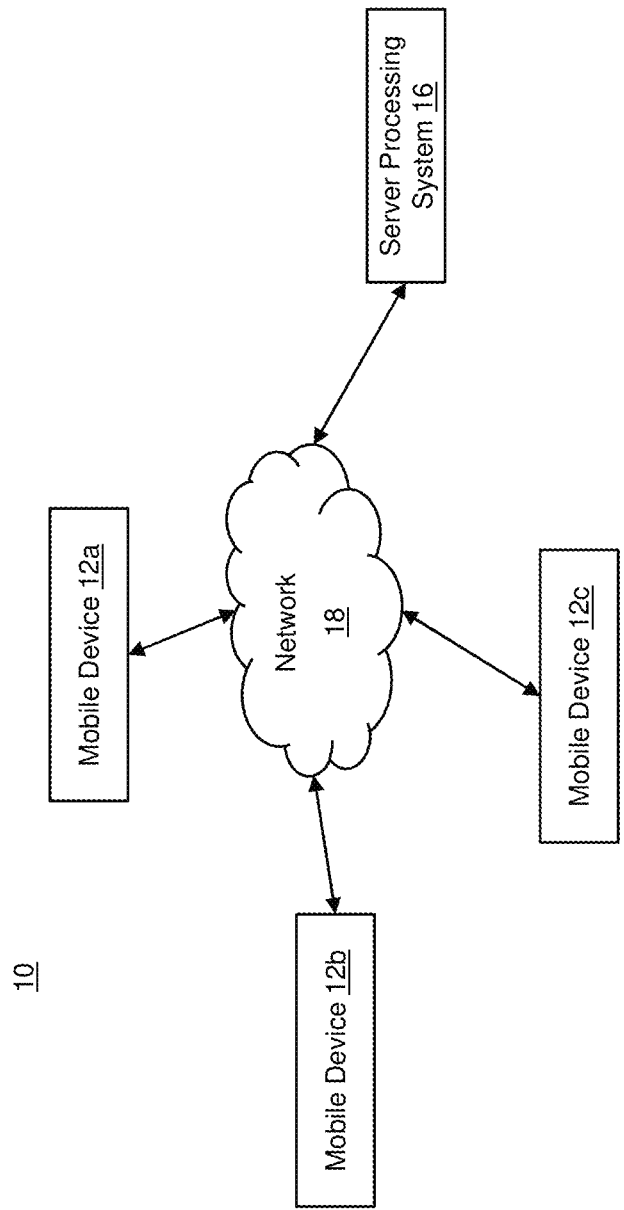
FIG. 1 is a diagram illustrating an environment in which a system according to an embodiment of the present disclosure operates.

The present invention is directed to methods and systems for equalizing calibration errors in magnetic sensor measurements in magnetic IPS systems.

Before explaining at least one embodiment of the invention in detail, it is to be understood that the invention is not necessarily limited in its application to the details of construction and the arrangement of the components and/or methods set forth in the following description and/or illustrated in the drawings and/or the examples. The invention is capable of other embodiments or of being practiced or carried out in various ways.

By way of introduction, a vectorial magnetic field measurement m can be of the form:

$$m = DRm_r + h,$$

in which $m_r$ is the true magnetic field being measured (i.e., Earth magnetic field), D is a scale matrix accounting for the soft iron effect, h is an offset accounting for the hard iron effect, and R is a matrix representing the orientation of the sensor device. In an ideal scenario in which the true values of D and h are known, the measurement value of m is an ideal measurement value of the true magnetic field. In practice, however, the magnetic field measurement is performed by a magnetic sensor device (e.g., magnetometer) to which the exact values of D and h are unknown, and thus estimations of D and h (denoted $\hat{D}$ and $\hat{h}$) must be used instead of the true values of D and h. As will be shown in the following formulation, inaccuracies in $\hat{D}$ and $\hat{h}$ will create a magnetic calibration error $m_{error}$ that is summed with $m_r$ to produce measurement me (i.e., $m_c = m_r + m_{error}$). In the following formulation an estimate of a variable is represented by $\hat{\phantom{x}}$ placed over the variable (e.g., $\hat{R}$ is an estimate of R).

Working back from the expression of $m = DRm_r + h$, the measurement $m_c$ can be expressed as:

$$m_c = \hat{R}^T \hat{D}^{-1}(m - \hat{h}).$$

Substituting the expression $m = DRm_r + h$ into the expression for $m_c$ yields:

$$m_c = \hat{R}^T \hat{D}^{-1}(DRm_r + h - \hat{h}).$$

Letting $\hat{R}^T\hat{D}^{-1} = R^T D^{-1} + \Delta_{RD}$ (where $\Delta_{RD}$ is an estimation error between the product of the true $R^T$ and $D^{-1}$ and the product of the estimates $\hat{R}^T$ and $\hat{D}^{-1}$), and letting $\hat{h} = h + \Delta_h$ (where $\Delta_h$ is an estimation error between the true hard iron effect and the estimated hard iron effect), $m_c$ can be expressed as:

$$m_c = (R^T D^{-1} + \Delta_{RD})(DRm_r + \Delta_h) = m_r + \Delta_{RD} DRm_r + R^T D^{-1}\Delta_h + \Delta_{RD}\Delta_h$$

The above expression for me can be approximated as:

$$m_c \approx m_r + \Delta_{RD} DRm_r + R^T D^{-1}\Delta_h = m_r + o(\|\Delta_{RD}m_r\|) = m_r + m_{error}.$$

Thus, a magnetic calibration error can be approximated to a fixed offset (in three-dimensional space. i.e., along each of the x, y, and z axes) over a period of time, as long as the magnetic sensor device remains at roughly the same orientation over the time period and the estimates are not updated significantly over the time period.

Bearing the above in mind, refer now to FIG. 1, an illustrative example environment in which embodiments of the present disclosure can be performed over a network 18. The embodiments include a system, generally designated 10, operative to equalize calibration errors in magnetic sensor measurements. The system 10 includes at least one (i.e., one or more) mobile device linked to a server processing system (SPS) 16 via the network 18, which can be formed from one or more networks including, for example, cellular networks, the internet, wide area, public, and local networks.

In the non-limiting example illustrated in FIG. 1, the at least one mobile device includes a plurality of mobile devices, generally designated 12a, 12b, and 12c. Although three mobile devices are illustrated in FIG. 1, the embodiments of the present disclosure can be implemented using a single mobile device, or using two or more mobile devices, and in certain instances up to several tens or even hundreds of mobile devices. Each of the mobile devices 12a, 12b, and 12c can be any type of communication device that includes one or more sensors, and moves or can be moved from one location to another, often while exchanging data via a communication network, such as a cellular network or a wireless local area network. Examples of such communication devices include, but are not limited to, smartphones, tablet computers, laptop computers, and the like. Most typically, the mobile devices 12a, 12b, and 12c are implemented as a smartphone (such as an iPhone from Apple of Cupertino, CA) or a tablet computer (such as an iPad also from Apple of Cupertino, CA).

Figure 2:
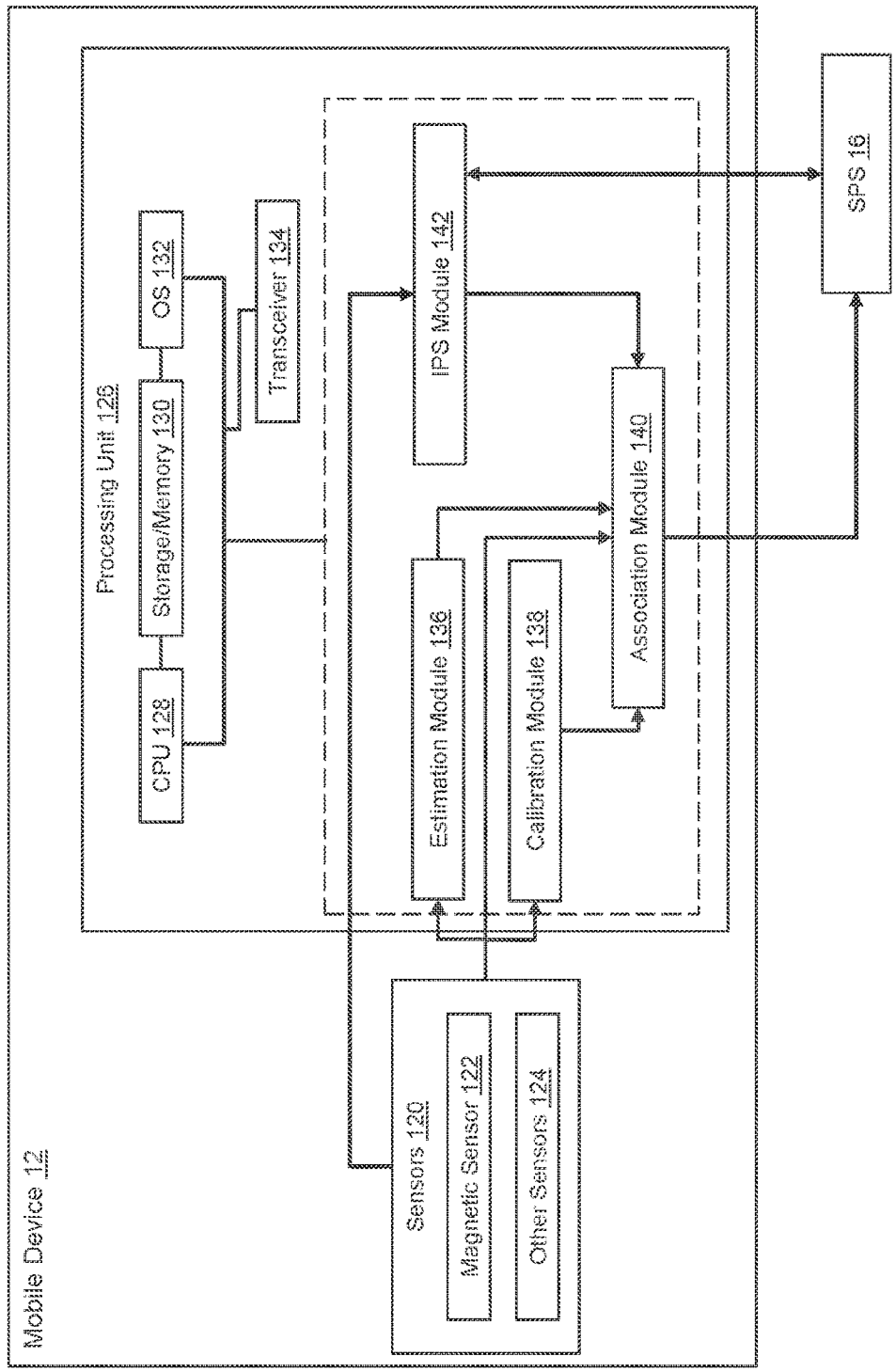
FIG. 2 is a diagram of the architecture of a mobile device of the system of FIG. 1, according to an embodiment of the present disclosure.

With continued reference to FIG. 1, refer now to FIG. 2, a schematic block diagram of a mobile device 12 that is a representation of each of the mobile devices 12a, 12b, and 12c. Throughout the remainder of the present disclosure, the description of the structure and function of the mobile device 12 (and its components) is applicable to the structure and function of each of the mobile devices 12a, 12b, and 12c.

The mobile device 12 includes one or more sensors 120 and a processing unit 126. The one or more sensors 120 includes at least one magnetic sensor device 122 which can be implemented as a magnetometer. Although the magnetic sensor 122 is shown as single components for representative purposes, the magnetic sensor may be multiple components. The magnetic sensor 122 collects magnetic sensor measurements at the mobile device 12 to perform magnetic sensing.

In certain embodiments, the one or more 120 preferably includes a plurality of sensors, which in addition to the at least one magnetic sensor 122 may include one or more other sensors 124, including, but not limited to one or more one or more inertial sensors such as one or more accelerometers and/or one or more gyroscopes, one or more barometers, one or more radio sensors, one or more image sensors (that are part of a camera (i.e., imaging device), which can be a depth camera, of the mobile device), one or more proximity sensors, or any other type of sensor that can provide sensor data that can be used by an indoor positioning system. When using one or more radio sensors, each radio sensor can be implemented as a radio frequency (RF) sensor that measures the power that is present in received radio signals, such as ultra-wideband (UWB) signals, cellular signals (e.g., CDMA signals. GSM signals, etc.) Bluetooth signals, wireless local area network (LAN) signals (colloquially referred to as "Wi-Fi signals"). In one non-limiting implementation, each radio sensor is implemented as a wireless LAN RF sensor configured to perform received signal strength indication (RSSI) measurements based on received wireless LAN signals from wireless LAN routers or beacons.

The magnetic sensor 122 is configured to generate magnetic sensor data in response to magnetic sensor measurements collected and performed at the mobile device 12. The sensor data is provided to the processing unit 126, which collects and processes the sensor data.

The processing unit 126 includes a central processing unit (CPU) 128, a storage/memory 130, an operating system (OS) 132, a transceiver unit 134, an estimation module 136, a calibration module 138, an association module 140, and an indoor positioning system (IPS) module 142. Although the CPU 128 and the storage/memory 130 are each shown as single components for representative purposes, either or both of the CPU and the storage/memory may be multiple components.

Figure 5:
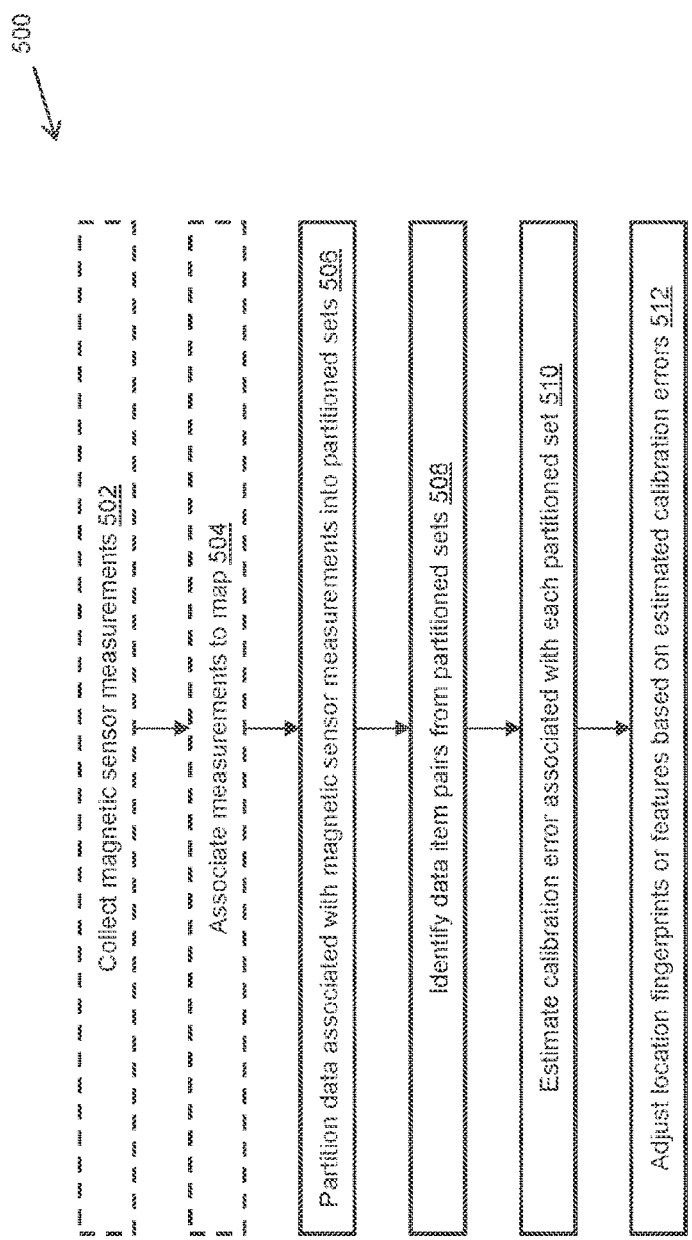
FIG. 5 is a flow diagram illustrating a process that includes steps for equalizing magnetic sensor calibration errors in magnetic sensor measurements.

The CPU 128 is formed of one or more computerized processors, including microprocessors, for performing the functions of the mobile device 12, including executing the functionalities and operations of the estimation module 136, the calibration module 138, the association module 140, and the IPS module 142, as will be detailed herein, including at least some of the processes shown and described in the flow diagrams of FIG. 5, as well as executing the functionalities and operations of the OS 132. The processors are, for example, conventional processors, such as those used in servers, computers, and other computerized devices. For example, the processors may include x86 Processors from AMD and Intel, Xeon® and Pentium® processors from Intel, as well as any combinations thereof.

The storage/memory 130 is any conventional computer storage media. The storage/memory 130 stores machine executable instructions for execution by the CPU 128, to perform the processes of the present embodiments. The storage/memory 130 also includes machine executable instructions associated with the operation of the components of the mobile device 12, including the sensors 120, and instructions for executing the processes of FIG. 5, as will be detailed herein.

The OS 132 includes any of the conventional computer operating systems, such as those available from Microsoft of Redmond Wash, commercially available as Windows® OS, such as Windows® 10, Windows® 7, Apple of Cupertino, CA, commercially available as MAC OS, or iOS, open-source software based operating systems, such as Android, and the like.

Each of the estimation module 136, the calibration module 138, the association module 140, and the IPS module 142 can be implemented as a hardware module or a software module, and includes software, software routines, code, code segments and the like, embodied, for example, in computer components, modules and the like, that are installed on the mobile device 12. Each of the estimation module 136, the calibration module 138, the association module 140, and the IPS module 142 performs actions when instructed by the CPU 128.

The transceiver unit 134 can be any transceiver that includes components, such as a modem and a network interface, for transmitting data to, and receiving data from, the network 18, so as to enable the exchange of data between the mobile device 12 and the SPS 16. The transceiver unit 134 can typically be implemented as a cellular network transceiver for communicating with a cellular network, such as, for example, a 3G, 4G, 4G LTE, or 5G cellular network. Such cellular networks are communicatively linked to other types of networks, including the Internet, via one or more network connections or communication hubs, thereby allowing the mobile device 12 to communicate with a variety of types networks, including those networks mentioned above.

All components of the mobile device 12 are connected or linked to each other (electronically and/or data), either directly or indirectly. These connections and links are represented by bold lines in FIG. 2. As can be seen in FIG. 2, some of the bold connection/link lines are terminated at one or both ends by an arrow, which represents the flow of data from one component of the system 10 to another component of the system 10. For example, the sensor data generated by the sensors 120 is provided to each of the estimation module 136, the calibration module 138, the association module 140, and the IPS module 142. As a further example, the outputs generated by the estimation module 136 and the calibration module 138 are provided as input to the association module 140, which also receives input from the sensors 120 and the IPS module 142. As a further example, outputs from the IPS module 142 are provided as input to the SPS 16 and outputs form the SPS 16 are provided as input to the IPS module 142.

The flow of data will be described in further detail in subsequent sections of the present disclosure.

Figure 3:
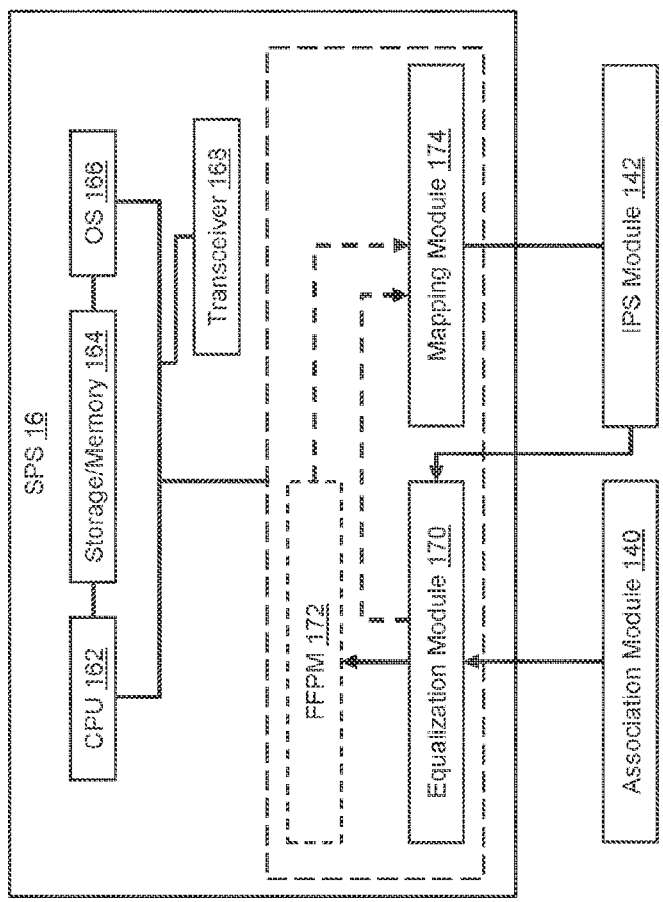
FIG. 3 is a diagram of the architecture of a server processing system (SPS) of the system of FIG. 1, according to an embodiment of the present disclosure.

With continued reference to FIGS. 1 and 2, refer now to FIG. 3 a schematic block diagram of the SPS 16. The SPS 16 includes a central processing unit (CPU) 162, a storage/memory 164, an operating system (OS) 166, a transceiver unit 168, an equalization module 170, and a mapping module 174. In certain embodiments, such as the non-limiting embodiment illustrated n FIG. 3, the SPS 16 further includes a fingerprint-features processing module (FFPM) 172. Although the CPU 162 and the storage/memory 164 are each shown as single components for representative purposes, either or both of the CPU and the storage/memory may be multiple components.

The CPU 162 is formed of one or more computerized processors, including microprocessors, for performing the functions of the SPS 16, including executing the functionalities and operations of the equalization module 170, the FFPM 172, and the mapping module 174, as will be detailed herein, including at least some of the processes shown and described in the flow diagrams of FIG. 5, as well as executing the functionalities and operations of the OS 166. The processors are, for example, conventional processors, such as those used in servers, computers, and other computerized devices. For example, the processors may include x86 Processors from AMD and Intel, Xeon® and Pentium® processors from Intel, as well as any combinations thereof.

The storage/memory 164 is any conventional computer storage media. The storage/memory 164 stores machine executable instructions for execution by the CPU 162, to perform the processes of the present embodiments. The storage/memory 164 also includes machine executable instructions associated with the operation of the components of the SPS 16, and instructions for executing the processes of FIG. 5, as will be detailed herein.

The OS 166 includes any of the conventional computer operating systems, such as those available from Microsoft of Redmond Wash, commercially available as Windows® OS, such as Windows® 10, Windows® 7, Apple of Cupertino, CA commercially available as MAC OS, or iOS, open-source software based operating systems, such as Android, and the like.

Each of the equalization module 170. FFPM 172, and the mapping module 174 can be implemented as a hardware module or a software module, and includes software, software routines, code, code segments and the like, embodied, for example, in computer components, modules and the like, that are installed on the mobile device 12. Each of the equalization module 170. FFPM 172, and the mapping module 174 performs actions when instructed by the CPU 162.

The transceiver unit 168 can be any transceiver that includes components, such as a modern and a network interface, for transmitting data to, and receiving data from, the network 18, so as to enable the exchange of data between the mobile device 12 and the SPS 16.

The modules 170, 172, 174 can be implemented in a single server (such as the SPS 16) or in multiple servers, where each such server typically includes one or more computerized processors, one or more storage/memory (computer storage media), an operating system, and a transceiver/network interface. Moreover, although FIGS. 2 and 3 show the modules as being distributed among the processing unit 126 and the SPS 16 in a particular way, other distributions are possible, including distributions in which all of the modules are deployed as part of the SPS 16 or one or more similar such servers.

The various modules of the processing unit 126 and the SPS 16 together form a processing subsystem that execute the processes of the present embodiments, including the processes shown and described in the flow diagrams of FIG. 5.

With continued reference to FIGS. 1-3, the following paragraphs describe the functions of each of the modules 136, 138, 140, 142, 170, 172, 174.

The estimation module 136 functions to estimate the orientation of the mobile device 12 over time in some reference frame. The estimation module 136 performs orientation estimation based on sensor data received from the sensors 120, which may include inertial sensor data (e.g., accelerometer data and/or gyroscope data) generated from the sensors 124. The orientation estimates produced by the estimation module 136 can be represented in various ways. One convenient representation is a vector representation, for example using conventional yaw, pitch, roll. Other representations include rotation matrices and quaternions. The orientation estimates are typically in the reference frame of the mobile device 12, and can be formed using any estimation technique, including motion estimation techniques that estimate location, orientation and velocity over time to form a time-varying position estimate.

Parenthetically, motion estimation techniques are well-known in the art. Pedestrian Dead Reckoning (PDR) is one well-known example motion estimation. PDR uses knowledge of the human gait cycle and the effect on signals generated by inertial sensors to estimate a trajectory. In a simple implementation, an accelerometer (one of the sensors 124) can be used as a pedometer and the magnetic sensor 122 can be used to provide compass heading. Each step taken by the user of the mobile device 12 (measured by the accelerometer) causes position to move forward a fixed distance in the direction measured by the compass (magnetic sensor 122). Another known, albeit relatively newer, approach for motion estimation relies on machine learning, in particular deep learning, techniques to train models that output trajectory estimates from available sensor signals carrying sensor data from inertial sensors. Yet another form of motion estimation that can provide accurate trajectory is performed by fusing sensor data from inertial sensors of a mobile device and a camera of the mobile device in a process known as Visual Inertial Odometry (VIO). Images obtained by the camera (i.e., image sensor data) are processed together with inertial measurements (inertial sensor data) to estimate location and orientation.

The calibration module 138 functions to perform a calibration process in order to calibrate the magnetic sensor measurements in the sensor data received from the sensor 120. The calibration performed by the calibration module 138 includes performing estimation processing of the received magnetic sensor data to estimate the soft and hard iron effect, and cancelling the estimated soft and hard iron effects. As mentioned in the background, the calibration processing has imperfections, and residual calibration errors remain.

The association module 140 functions to associate the sensor measurements performed at a location (location fingerprint) to coordinates of an indoor map (either a fingerprint map or feature map). In certain embodiments, some of the functions performed by the association module 140 can be performed by the IPS module 142.

In general, the association of the sensor measurements to the map coordinates is performed based on the sensor data received from the sensors 120, as well as the orientation estimation output by the estimation module 136 and the calibration processed sensor data output by the calibration module 138.

Since the orientation estimates are typically in the reference frame of the mobile device 12, in order to utilize fingerprints derived from sensor measurements from multiple mobile devices 12, alignment of the orientations of the mobile devices 12 to a common reference frame is needed. In certain embodiments, the IPS module 142 functions to align the orientation of each mobile device 12 to the reference frame of the map, such that fingerprints received from each mobile device 12 will be in a common map reference frame. The orientation alignment performed by the IPS module 142 is also useful in situations in which the fingerprints from only a single mobile device 12 are used but the fingerprints are generated over a relatively large time period over which the orientation of the mobile device 12 changes significantly. Here too the IPS module 142 can align the orientation estimate corresponding to each fingerprint to the map reference frame. Note that after the IPS module 142 performs the alignment, the IPS module 142 also associates the fingerprints to the map. This process can be done manually, or semi-manually, using for example the mapping tool described in US Patent Application Publication No. 2020/0340815, whose disclosure is incorporated by reference in its entirety herein.

In certain embodiments, the IPS module 142 can provide a sample-by-sample orientation estimate of the mobile device 12. In such embodiments, it may not be necessary for the estimation module 136 to perform orientation estimation to determine the orientation of the mobile device 12 (since the IPS module 142 provides mobile device orientation). However, in such embodiments the estimation module 136 may function to perform reference frame alignment, whereby the estimation module 136 estimates the mobile device 12 orientation in some initial reference frame and aligns the magnetic sensor measurements collected by the magnetic sensor 122 to that initial reference frame. The aligned magnetic sensor measurements can then be aligned to the map reference frame by the IPS module 142.

The equalization module 170 functions to receive the associated sensor measurements (i.e., the sensor measurements that have been associated to the map reference frame) from the association module 140 and/or the IPS module 142, and to perform equalization processing of data generated from the received sensor measurements in order to estimate calibration errors associated with the magnetic sensor measurements. The equalization processing performed by the equalization module 170 will now be described in detail within the context of the non-limiting embodiment of the present disclosure illustrated in drawings. However, as will be discussed, the equalization processing can be modified in accordance with other embodiments of the present disclosure.

According to certain non-limiting embodiments illustrated herein, the associated sensor measurements are magnetic sensor measurements that are associated with (and typically form part of) a fingerprint location. In such embodiments, the data generated from the received sensor measurements that is to undergo equalization processing is location fingerprint data that includes for each data item of the location fingerprint data at least one magnetic sensor measurement and a spatial location (which can be a location in three-dimensional space or two-dimensional space). Typically, multiple magnetic sensor measurements are collected at the same or approximately the same location. The system 10 according to the present disclosure uses the multiple sensor measurements to advantage in order to equalize the calibration error associated with the magnetic sensor measurements by employing partitioning and estimation techniques. First, the equalization module 170 partitions the data (which in certain non-limiting embodiments is location fingerprint data) into multiple partitioned sets of data according to one or more partitioning schemes, such that each partitioned set has a fixed (or approximately fixed) associated magnetic sensor measurement calibration error. In other words, for each partitioned set, the calibration error associated with the particular magnetic sensor measurements used to generate the data in the partitioned set is the same (or approximately the same) across the particular magnetic sensor measurements.

Various partitioning schemes can be used to form the partitioned sets. In one example, the data is partitioned according to mobile device orientation. In such a partitioning scheme, the orientation estimates produced by the estimation module 136 are used as a basis for partitioning, whereby magnetic sensor measurements that were performed at the same or similar (within a similarity threshold between orientation estimates) are grouped in the same partitioned set. In another example, the data is partitioned according to a mobile device identifier, such that magnetic sensor measurements performed by a given mobile device (e.g., one of the mobile devices 12a, 12b, 12c of FIG. 1) are grouped in the same partitioned set. In yet another example, the data is partitioned according to timestamps associated with the magnetic sensor measurements, whereby magnetic sensor measurements that were collected (preferably continuously) over a time period (preferably during which the orientation of the mobile device is constant) are grouped in the same partitioned set. In a further example, the data is partitioned according to sensor measurements corresponding to a recognizable trajectory or path estimate, whereby magnetic sensor measurements that were collected (preferably continuously) in a recognizable trajectory/path are grouped in the same partitioned set. In a final example, magnetic sensor measurements associated with location fingerprints that were already (i.e., previously) equalized are grouped in the same partitioned set.

Figure 4:
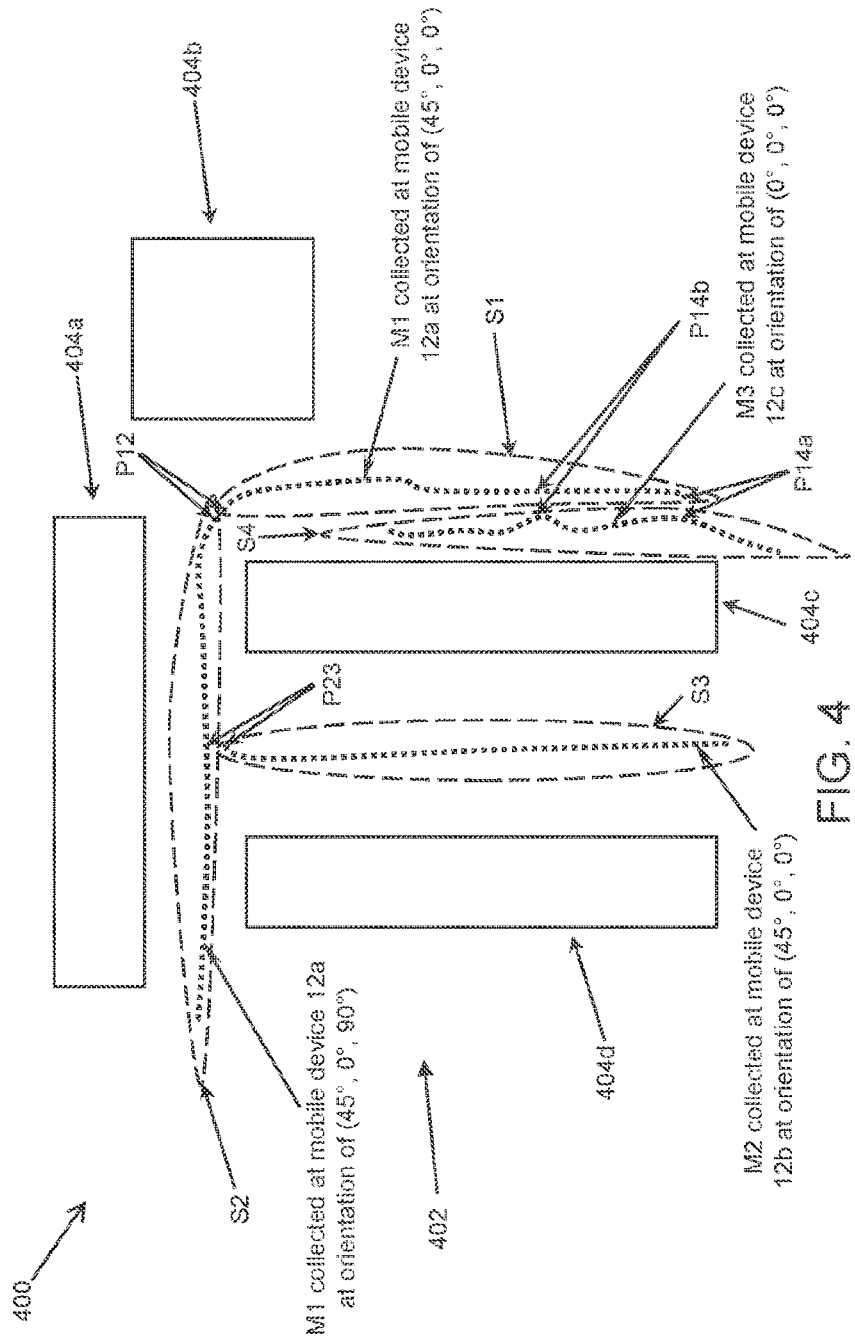
FIG. 4 is a schematic representation of a fingerprint map, generated in part from magnetic sensor measurements collected by magnetic sensors of mobile devices of the system of FIG. 1, and partitioning of fingerprint data according to a partitioning scheme.

The above partitioning schemes are merely examples of possible partitioning schemes that can be employed by the embodiments of the present disclosure, and should not be interpreted to be exhaustive. As should be apparent, various partitioning schemes can be used in combination in order to generate the partitioned sets of data. FIG. 4 schematically illustrates magnetic sensor measurements in a fingerprint map 400 and the partitioning of location fingerprint data according to a combination of mobile device orientation and mobile device identifier. The fingerprint map 400 shows location fingerprint data formed from magnetic sensor measurement data and location data. The magnetic sensor measurement data is generated from magnetic sensor measurements collected by magnetic sensors of three different mobile devices (e.g., mobile device 12a, mobile device 12b, and mobile device 12c) at various locations (corresponding to the location data) of an indoor environment 402 that includes landmarks 404a-d (which can be structures, walls, shelves, vending machines, furniture, stands, etc.). As previously mentioned, each of the three mobile devices 12a. 12b. 12c is according to the mobile device 12 of FIG. 2. Each of the mobile devices 12a. 12b. 12c also has an associated orientation estimate at each location (which can be estimated by the estimation module 136 of the mobile device).

The location fingerprint data M2 is generated from the magnetic sensor measurements collected by the magnetic sensor of the mobile device 12b while traversing locations of the indoor environment 402. The mobile device 12b has an estimated orientation (yaw, pitch, roll) of approximately (45°, 0°, 0°) over the entire duration of time for which the magnetic sensors measurements are collected by the magnetic sensor of the mobile device 12b. Each dot in M2 represents a location fingerprint data item, defined by a location of the indoor environment 402 and the magnetic sensor measurement that was collected/performed by the magnetic sensor of the mobile device 12b at that location.

The location fingerprint data M3 is generated from the magnetic sensor measurements collected by the magnetic sensor of the mobile device 12c while traversing locations of the indoor environment 402. The mobile device 12c has an estimated orientation (yaw, pitch, roll) of approximately (0°, 0°, 0°) over the entire duration of time for which the magnetic sensors measurements are collected by the magnetic sensor of the mobile device 12b. Each dot in M3 represents a location fingerprint data item, defined by a location of the indoor environment 402 and the magnetic sensor measurement that was collected/performed by the magnetic sensor of the mobile device 12c at that location.

The location fingerprint data M1 is generated from the magnetic sensor measurements collected by the magnetic sensor of the mobile device 12a while traversing locations of the indoor environment 402. The mobile device 12a has an estimated orientation (yaw, pitch, roll) of approximately (45°, 0°, 90°) over a first segment of the duration of time for which the magnetic sensors measurements are collected by the magnetic sensor of the mobile device 12b, and an estimated orientation (yaw, pitch, roll) of approximately (45°, 0°, 0°) over a second segment of the duration of time for which magnetic sensors measurements are collected by the magnetic sensor of the mobile device 12b. Each dot in M1 represents a location fingerprint data item, defined by a location of the indoor environment 402 and the magnetic sensor measurement that was collected/performed by the magnetic sensor of the mobile device 12a at that location.

In the illustrated example, the equalization module 170 partitions the data into four partitioned sets according to a combination of mobile device orientation and mobile device identifier. The mobile device identifier is an identifier that uniquely identifies each mobile device (e.g., the identifier of each of the mobile devices 12a, 12, 12c). The partitioned sets are depicted as oval or oblong shapes demarcated with dashed lines. The first partitioned set, designated as S1, includes the part of the data M1 that is generated from the magnetic sensor measurements collected by the mobile device 12a at locations in which the mobile device 12a had an estimated orientation of approximately (45°, 0°, 0°). The second partitioned set, designated as S2, includes the part of the data M1 that is generated from the magnetic sensor measurements collected by the mobile device 12a at locations in which the mobile device 12a had an estimated orientation of approximately (45°, 0°, 90°). The third partitioned set, designated as S3, includes the data M2, which is generated from the magnetic sensor measurements collected by the mobile device 12b at locations in which the mobile device 12b had an estimated orientation of approximately (45°, 0°, 0°). The fourth partitioned set, designated as S4, includes the data M3, which is generated from the magnetic sensor measurements collected by the mobile device 12c at locations in which the mobile device 12c had an estimated orientation of approximately (0°, 0°, 0°).

For each of the partitioned sets, the orientation of the device carrying the magnetic sensor is approximately constant (i.e., fixed), and therefore the calibration error associated with the magnetic sensor measurements that are used to generate the data in the partitioned set is effectively the same (fixed) across the magnetic sensor measurements. Thus, each partitioned set is associated with a respective fixed calibration error. In other words, the same fixed calibration error C1 is present across all of the magnetic sensor measurements in the data M1 in set S1. Likewise, the same fixed calibration error C2 is present across all of the magnetic sensor measurements in the data M1 in set S2, and the same fixed calibration error C3 is present across all of the magnetic sensor measurements in the data M2 in set S3, and the same fixed calibration error C4 is present across all of the magnetic sensor measurements in the data M3 in set S4. The calibration errors C1, C2, C3 and C4 are not necessarily the same, and in fact are typically different from each other, as the calibration error is a function of both the magnetic sensor device itself as well as the orientation of the mobile device that carries the magnetic sensor device (e.g., sensor 122).

After the equalization module 170 partitions the data into the partitioned sets, the equalization module 170 then identifies one or more pairs of data items (also referred to as "pairs". "data item pairs", or "paired data items"), where each pair includes a data item (a "first data item") from one of the partitioned sets (a "first of the partitioned sets") and a data item (a "second data item") from another one of the partitioned sets (a "second of the partitioned sets"). The first data item corresponds to a magnetic sensor measurement in the first set that is associated with a first location, and the second data item corresponds to a magnetic sensor measurement in the second set that is associated with a location (second location) that is the same or approximately the same as the first location. The first and second data items may include the magnetic sensor measurements themselves (as in the current embodiment), or can be features associated with the magnetic sensor measurements, which in certain embodiments can be derived from the sensor measurements (as will be discussed in further detail).

Various conditions for qualification of "the same" or "approximately the same" can be used. In certain non-limiting implementations, for example when fingerprint locations are used, the second location is determined to be the same or approximately as the first location if the two locations are within a certain distance (e.g., Euclidean distance) from each other, i.e., if the distance between the two locations is within a given amount. In other non-limiting implementations, for example when magnetic fingerprint locations are used, the second location is determined to be the same or approximately as the first location if the two magnetic fingerprints are within a certain distance from each other. In yet other non-limiting implementations, in particular when the data items include magnetic feature data, the second location is determined to be the same or approximately as the first location if the magnetic features associated with the sensor measurements are within a certain distance from each other.

In the illustrated embodiment, the pairs of data items are referred to interchangeably as "paired fingerprints". Continuing with the example fingerprint map 400 illustrated in FIG. 4, several paired fingerprints are shown, designated as P23, P12, P14a, and P14b. Looking at the paired fingerprint P23 as an example, the paired fingerprint consists of: i) a first data item corresponding to a magnetic sensor measurement performed by the mobile device 12a (from the set of magnetic sensor measurements in data M1) in the partitioned set S1 at a first location (in data M1 corresponding to that magnetic sensor measurement), and ii) a second data item corresponding to a magnetic sensor measurement performed by the mobile device 12b (from the set of magnetic sensor measurements in data M2) in the partitioned set S3 at a second location (in data M2 corresponding to that magnetic sensor measurement) that is the same or approximately the same as the first location. Here, the two sensor measurements are collected by two different mobile devices (the mobile device 12a and the mobile device 12b).

Similarly, the paired fingerprint P12 consists of: i) a first data item corresponding to a magnetic sensor measurement performed by the mobile device 12a (from the set of magnetic sensor measurements in data M1) in the partitioned set S1 at a first location (in data M1 corresponding to that magnetic sensor measurement), and ii) a second data item corresponding to a magnetic sensor measurement performed by the mobile device 12a (from the set of magnetic sensor measurements in data M1) in the partitioned set S2 at a second location (in data M1 corresponding to that magnetic sensor measurement) that is the same or approximately the same as the first location. Here, the two sensor measurements are collected by the same device (Device 1), but correspond to two different orientations of the mobile device.

Similarly, the paired fingerprint P14a consists of: i) a first data item corresponding to a magnetic sensor measurement performed by the mobile device 12a (from the set of magnetic sensor measurements in data M1) in the partitioned set S1 at a first location (in data M1 corresponding to that magnetic sensor measurement), and ii) a second data item corresponding to a magnetic sensor measurement performed by the mobile device 12c (from the set of magnetic sensor measurements in data M3) in the partitioned set S4 at a second location (in data M3 corresponding to that magnetic sensor measurement) that is the same or approximately the same as the first location. Here, the two sensor measurements are collected by two different mobile devices (the mobile device 12a and the mobile device 12c). These two mobile devices are also responsible for contributing the data of the paired fingerprint P14b, which consists of: i) a "second" first data item corresponding to a magnetic sensor measurement performed by the mobile device 12a (from the set of magnetic sensor measurements in data M1) in the partitioned set S1 at a "second" first location (in data M1 corresponding to that magnetic sensor measurement), and ii) a "second" second data item corresponding to a magnetic sensor measurement performed by the mobile device 12c (from the set of magnetic sensor measurements in data M3) in the partitioned set S4 at a "second" second location (in data M3 corresponding to that magnetic sensor measurement) that is the same or approximately the same as the "second" first location.

To be clear, any two partitioned sets may have none, one, or multiple paired data items. As in the example fingerprint map 400 illustrated in FIG. 4, no paired data items are formed from pairs taken from S3 and S4, while the sets S1 and S4 together form two paired data items (P14a, P14b).

After the equalization module 170 identifies the pairs (and forms the pairs by taking one data item from each of the two contributing partitioned sets of the pair), the equalization module 170 estimates the fixed calibration error associated with each of the partitioned sets. In general, the estimation is performed by minimizing a cost function of the form:

$$\Sigma_{i=1}^{N}|m1_i-m2_i|^2,$$

in which $m1_i$ is the associated magnetic sensor measurement in the data item from one of the partitioned sets forming the $i^{th}$ data item pair, and $m2_i$ is the associated magnetic sensor measurement in the data item from the other of the partitioned sets forming the $i^{th}$ data item pair. According to this formulation, the square of the difference between the magnetic sensor measurements in each pair of data items are summed together. The cost function is minimized to produce an estimate for the calibration error associated with each of the partitioned sets that is represented by at least one of the pairs of data items. Since the magnetic sensor measurements associated with $m1_i$ and $m2_i$ should be associated with the same (or approximately the same) location, it is reasonable to assume that the true sensor measurements (without calibration error) should be identical (or at least very close. i.e., within some small amount S from each other). Thus, minimization of the cost function (when performed over all pairs of data items) provides a robust estimate of the calibration error associated with each of the partitioned sets.

In practice, the equalization module 170 can perform the calibration error estimation in various ways. In one non-limiting implementation, least squares estimation is employed by the equalization module 170. In another non-limiting implementation, the equalization module 170 employs singular value decomposition to estimate the calibration errors. In another non-limiting implementation, the equalization module 170 employs algorithms that handle outlier data points, such as random sample consensus (RANSAC), which is an iterative method that estimates parameters of a mathematical model. In RANSAC implementations, the equalization module 170 iteratively executes over subsets of the pairs of data items together with a fitting model (which can be derived from the resulting minimized cost function) in order to remove outlier data from the estimate.

In certain embodiments, the equalization module 170 performs detection of outlier calibration error estimates for the partitioned sets. In one non-limiting implementation, the equalization module 170 identifies calibration error estimates as outliers if the calibration error estimates are: i) stale (i.e., the estimates are old compared to more recent calibration error estimates), and/or ii) do not conform with the majority of the calibration error estimate data. In certain embodiments, the equalization module 170 removes the outlier calibration error estimates, and removes the location fingerprints in the partitioned set associated with an outlier calibration error estimate.

The equalization module 170 further functions to modify, for each of the partitioned sets, the data in the partitioned set based on the estimated calibration error associated with the partitioned set so as to equalize the calibration error for the partitioned set. The modified data that is output by the equalization module 170 is referred to as equalized data, which can be equalized location fingerprints or equalized location features. In one simple example, if the calibration error associated with a partitioned set is estimated to be some positive error A, the magnetic sensor measurements used to generate the data in the partitioned set are adjusted by the calibration error by, for example, subtracting Δ from the magnetic sensor measurements associated with the partitioned set. Other, more complex modifications/adjustments are also contemplated, including modification by some offset that is a function of the estimated calibration error.

In certain embodiments, the equalization module 170 further functions to detect fingerprints that are in the vicinity of two or more different paired data items that are separated from each other by a significant distance. For example, a location fingerprint that is in the vicinity of both paired fingerprint P12 and paired fingerprint P14b could be detected as an outlier. The equalization module 170 can remove the detected outlier fingerprint from the corresponding partitioned set. The removal can be performed by the equalization module 170 before the equalization process (i.e., before set partitioning, calibration error estimation, and data modification to generate equalized location fingerprints), after the completion of the equalization process (i.e., after data modification to generate equalized location fingerprints), or during (as part of) the equalization process.

In certain embodiments, such as the non-limiting embodiment illustrated in FIG. 3, the FFPM 172 functions to compute map features from the equalized location fingerprints in order to generate equalized location features associated with the magnetic sensor measurements. In other embodiments, the FFPM 172 may first compute map features from the un-equalized data, and then provide the un-equalized feature map data to the equalization module 170. In such embodiments, the equalization module 170 performs estimation on the computed map features (derived from the magnetic sensor measurements) instead of directly on the magnetic measurements. In this case, the estimation is performed by minimizing a cost function of the form:

$$\Sigma_{i=1}^{N}|f(m1_i)-f(m2_i)|^2.$$

in which $f$ is a magnetic feature operator or function. The feature operator $f$ is not necessarily limited to a single location measurement (i.e., magnetic sensor measurements associated with different locations may be associated with different feature operators).

The equalized location fingerprints (from the equalization module 170) or the equalized location features (from the equalization module 170 or from the FFPM 172) are then provided to the mapping module 174, which functions to update the map data of the fingerprint map or feature map, and provide the updated fingerprint/feature map to the IPS module 142.

In certain embodiments, the aforementioned cost functions that are to be minimized in order to estimate the calibration error by the equalization module 170 can be weighted according to one or more weighting criterion. By way of one non-limiting example, weights can be applied to a cost function according to the distance between the fingerprint locations or location features, where preferably the weight is inversely proportional to the distance. For example, for a given data item pair k, a large weight can be applied if there is a small distance between the location associated with $m1_k$ and the location associated with $m2_k$. Similarly, for another given data item pair j, a small weight can be applied if there is a large distance between the location associated with the $m1_j$ and the location associated with $m2_j$. As another example, the cost function can be weighted by a configurable association error that may be a function of the sensor quality or error of the association of a particular magnetic sensor measurement with a particular location. For example, if the magnetic sensor measurements in a given data item pair have a high quality (i.e., the sensors that collected the sensor measurements have a high reliability factor), a large weight may be applied to that data item pair, as compared to magnetic sensor measurements of another data item pair that were collected by less reliable (lower quality) magnetic sensors. In yet another example, the cost function can be weighted based on the timestamps associated with the magnetic sensor measurements, such that larger weights are applied to more recent magnetic sensor measurements. For example, for a first data item pair having magnetic sensor measurements that were collected more recently than magnetic sensor measurements of a second data item pair, a larger weight can be applied to the first data item pair as compared to the weight applied to the second data item pair.

Attention is now directed to FIG. 5, which shows a flow diagram detailing a process 500 in accordance with embodiments of the disclosed subject matter. The process includes an algorithm for equalizing magnetic sensor calibration errors in magnetic sensor measurements collected by a mobile device or mobile devices. Reference is also made to FIGS. 1-4 and the elements illustrated therein. The process and sub-processes of FIG. 5 include computerized (i.e., computer-implemented) processes performed by the system, including, for example, the CPU 162 and/or the CPU 128 and associated components, including the equalization module 170, and in certain embodiments one or more of the estimation module 136, the calibration module 138, the association module 140, the IPS module 142, the FFPM 172, and the mapping module 174. The aforementioned process and sub-processes are for example, performed automatically, but can be, for example performed manually, and are performed, for example, in real time.

The process 500 begins at step 502, where magnetic sensor measurements are collected by the magnetic sensor 122 of one or more mobile devices 12 as the mobile device traverses through an indoor environment. Each magnetic sensor measurement corresponds to a location within the indoor environment at which the magnetic sensor 122 performed the measurement. At step 504, the association module 140 of each mobile device 12 associates the magnetic sensor measurements (collected by the magnetic sensor 122 at a location, i.e., location fingerprint) to coordinates of an indoor map (either a fingerprint map or feature map). The process then moves to step 506. In embodiments in which a map with associated magnetic sensor measurements already exists, the process 500 can begin from step 506.

At step 506, the equalization module 170 partitions data associated with the already associated magnetic sensor measurements into a plurality of partitioned sets of data. The equalization module 170 partitions the data (using one or more partitioning schemes) in a way such that each partitioned set has a fixed (or approximately fixed) associated magnetic sensor measurement calibration error.

The process 500 then moves to step 508, where the equalization module 170 identifies one or more pairs of data items that each consist of a first data item from one of the partitioned sets and a second data item from another one of the partitioned sets. As previously discussed, the first data item corresponds to a magnetic sensor measurement in the one partitioned set that is associated with a first location, and the second data item corresponds to a magnetic sensor measurement in the other partitioned set that is associated with a second location that is the same or approximately the same as the first location.

At step 510, the equalization module 170 estimates the fixed calibration error associated with each of the partitioned sets based on the pairs of data items, by, for example, minimizing a cost function. At step 512, the location fingerprints are adjusted based on the estimated calibration errors. The adjustment is made by modifying the data in each partitioned set based on the estimated calibration error associated with the partitioned set so as to equalize the calibration error for the partitioned set. In embodiments in which features are used instead of location fingerprint (i.e., if the equalization module 170 performs estimation on the computed map features (derived from the magnetic sensor measurements) instead of directly on the magnetic measurements), the features are adjusted based on the estimated calibration errors. Here the adjustment is made by modifying the feature data in each partitioned set based on the estimated calibration error associated with the partitioned set.

The subdivision of the processing units/systems into various processing modules has been shown herein according to a functional subdivision and for convenience of representation. It should be noted that these functions can be performed by processing systems or other logic circuitry hardware which can be subdivided in any desired manner, with one or more functions being performed by a single processing module of a single processing system, or by a single function being performed by separate processing modules of one or more distributed processing systems. In an extreme example, the mobile device 12 can be limited to include only the sensors 120 and the processing components that are initially part of the mobile device 12, and the various processing modules 136, 138, 140, 142 can be deployed as part of a remote processing system, for example the SPS 16. In such an example, all of the sensor data (generated by the sensors 120 in response to collected sensor measurements) can be provided to the various processing modules (e.g., the SPS 16) through a communication link supported by the mobile device 12 and the SPS 16, for example via the transceiver units 134, 168.

Implementation of the method and/or system of embodiments of the invention can involve performing or completing selected tasks manually, automatically, or a combination thereof. Moreover, according to actual instrumentation and equipment of embodiments of the method and/or system of the invention, several selected tasks could be implemented by hardware, by software or by firmware or by a combination thereof using an operating system.

For example, hardware for performing selected tasks according to embodiments of the invention could be implemented as a chip or a circuit. As software, selected tasks according to embodiments of the invention could be implemented as a plurality of software instructions being executed by a computer using any suitable operating system. In an exemplary embodiment of the invention, one or more tasks according to exemplary embodiments of method and/or system as described herein are performed by a data processor, such as a computing platform for executing a plurality of instructions. Optionally, the data processor includes a volatile memory for storing instructions and/or data and/or a non-volatile storage, for example, non-transitory storage media such as a magnetic hard-disk and/or removable media, for storing instructions and/or data. Optionally, a network connection is provided as well. A display and/or a user input device such as a keyboard or mouse are optionally provided as well.

For example, any combination of one or more non-transitory computer readable (storage) medium(s) may be utilized in accordance with the above-listed embodiments of the present invention. The non-transitory computer readable (storage) medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

As will be understood with reference to the paragraphs and the referenced drawings, provided above, various embodiments of computer-implemented methods are provided herein, some of which can be performed by various embodiments of apparatuses and systems described herein and some of which can be performed according to instructions stored in non-transitory computer-readable storage media described herein. Still, some embodiments of computer-implemented methods provided herein can be performed by other apparatuses or systems and can be performed according to instructions stored in computer-readable storage media other than that described herein, as will become apparent to those having skill in the art with reference to the embodiments described herein. Any reference to systems and computer-readable storage media with respect to the following computer-implemented methods is provided for explanatory purposes, and is not intended to limit any of such systems and any of such non-transitory computer-readable storage media with regard to embodiments of computer-implemented methods described above. Likewise, any reference to the following computer-implemented methods with respect to systems and computer-readable storage media is provided for explanatory purposes, and is not intended to limit any of such computer-implemented methods disclosed herein.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

As used herein, the singular form "a", "an" and "the" include plural references unless the context clearly dictates otherwise.

The word "exemplary" is used herein to mean "serving as an example, instance or illustration". Any embodiment described as "exemplary" is not necessarily to be construed as preferred or advantageous over other embodiments and/or to exclude the incorporation of features from other embodiments.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

The above-described processes including portions thereof can be performed by software, hardware and combinations thereof. These processes and portions thereof can be performed by computers, computer-type devices, workstations, processors, micro-processors, other electronic searching tools and memory and other non-transitory storage-type devices associated therewith. The processes and portions thereof can also be embodied in programmable non-transitory storage media, for example, compact discs (CDs) or other discs including magnetic, optical, etc., readable by a machine or the like, or other computer usable storage media, including magnetic, optical, or semiconductor storage, or other source of electronic signals.

The processes (methods) and systems, including components thereof, herein have been described with exemplary reference to specific hardware and software. The processes (methods) have been described as exemplary, whereby specific steps and their order can be omitted and/or changed by persons of ordinary skill in the art to reduce these embodiments to practice without undue experimentation. The processes (methods) and systems have been described in a manner sufficient to enable persons of ordinary skill in the art to readily adapt other hardware and software as may be needed to reduce any of the embodiments to practice without undue experimentation and using conventional techniques.

To the extent that the appended claims have been drafted without multiple dependencies, this has been done only to accommodate formal requirements in jurisdictions which do not allow such multiple dependencies. It should be noted that all possible combinations of features which would be implied by rendering the claims multiply dependent are explicitly envisaged and should be considered part of the invention.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

What is claimed is:

1. A method, comprising:
    partitioning data from a plurality of magnetic sensor measurements collected at one or more mobile devices into a plurality of partitioned sets of data, each of the magnetic sensor measurements associated with a location of one of the mobile devices and having an associated calibration error, the partitioning such that each partitioned set is associated with a respective calibration error associated with the magnetic sensor measurements used to generate the data in the partitioned set;
    identifying one or more pairs of data items, each pair including:
        a data item from a first of the partitioned sets corresponding to a magnetic sensor measurement, associated with a first location, used to generate the data in the first partitioned set, and
        a data item from a second of the partitioned sets corresponding to a magnetic sensor measurement, associated with a second location that is substantially the same as the first location, used to generate the data in the first partitioned set; and
    estimating the calibration error associated with each of the partitioned sets based in part on the one or more pairs.

2. The method of claim 1, further comprising: for each partitioned set of the partitioned sets, modifying the data in the partitioned set based on the estimated calibration error associated with the partitioned set.

3. The method of claim 1, further comprising: associating the magnetic sensor measurements with locations in a map reference frame.

4. The method of claim 1, wherein for each pair, the second location is substantially the same as the first location if the first and second locations are within a certain distance from each other.

5. The method of claim 1, wherein for each pair, the first and second locations are magnetic feature locations, and wherein the second location is substantially the same as the first location if the magnetic feature locations are within a certain distance from each other.

6. The method of claim 1, wherein for each pair, the first and second locations are fingerprint locations.

7. The method of claim 1, wherein for each pair, the first and second locations are magnetic fingerprint locations.

8. The method of claim 1, wherein the partitioning is performed based on at least one of: orientation of the one or more mobile devices, or the mobile devices at which the magnetic sensor measurements are collected.

9. The method of claim 1, wherein the data generated from the plurality of magnetic sensor measurements includes fingerprint location data that associates the magnetic sensor measurements to coordinates of an indoor map.

10. The method of claim 1, wherein the data generated from the plurality of magnetic sensor measurements includes magnetic feature data derived from the magnetic sensor measurements.

11. The method of claim 1, wherein the estimation is performed by minimizing a cost function that is a function of the magnetic sensor measurements associated with the data pairs.

12. The method of claim 1, wherein the one or more mobile devices includes exactly one mobile device, and wherein the magnetic sensor measurements are collected at the exactly one mobile device at a plurality of different orientations.

13. The method of claim 1, wherein the one or more mobile devices includes at least first and second mobile devices, and wherein at least some of the magnetic sensor measurements are collected at the first mobile device and at least some of the magnetic sensor measurements are collected at the second mobile device.

14. A system, comprising:
    a processing subsystem associated with one or more mobile devices including at least one processor in communication with a memory, the processing subsystem configured to:
        partition data from a plurality of magnetic sensor measurements collected at one or more mobile devices into a plurality of partitioned sets of data, each of the magnetic sensor measurements associated with a location of one of the mobile devices and having an associated calibration error, the partitioning such that each partitioned set is associated with a respective calibration error associated with the magnetic sensor measurements used to generate the data in the partitioned set, identify one or more pairs of data items, each pair including:
- a data item from a first of the partitioned sets corresponding to a magnetic sensor measurement, associated with a first location, used to generate the data in the first partitioned set, and
- a data item from a second of the partitioned sets corresponding to a magnetic sensor measurement, associated with a second location that is substantially the same as the first location, used to generate the data in the first partitioned set; and estimate the calibration error associated with each of the partitioned sets based in part on the one or more pairs.

15. The system of claim 14, wherein the processing subsystem is further configured to: for each partitioned set of the partitioned sets, modify the data in the partitioned set based on the estimated calibration error associated with the partitioned set.

16. The system of claim 14, further comprising: one or more magnetic sensors carried by the one or more mobile devices for collecting the magnetic sensor measurements, and wherein the processing subsystem is further configured to associate the magnetic sensor measurements with locations in a map reference frame.

17. The system of claim 14, wherein for each pair, the second location is substantially the same as the first location if the first and second locations are within a certain distance from each other.

18. The system of claim 14, wherein for each pair, the first and second locations are fingerprint locations.

19. The system of claim 14, wherein for each pair, the first and second locations are magnetic fingerprint locations.

20. A computer usable non-transitory storage medium having a computer program embodied thereon for causing a suitable programmed system to estimate calibration errors associated with magnetic sensor measurements, by performing the following steps when such program is executed on the system, the steps comprising:

partitioning data from a plurality of magnetic sensor measurements collected at one or more mobile devices into a plurality of partitioned sets of data, each of the magnetic sensor measurements associated with a location of one of the mobile devices and having an associated calibration error, the partitioning such that each partitioned set is associated with a respective calibration error associated with the magnetic sensor measurements used to generate the data in the partitioned set;

identifying one or more pairs of data items, each pair including:
- a data item from a first of the partitioned sets corresponding to a magnetic sensor measurement, associated with a first location, used to generate the data in the first partitioned set, and
- a data item from a second of the partitioned sets corresponding to a magnetic sensor measurement, associated with a second location that is substantially the same as the first location, used to generate the data in the first partitioned set; and estimating the calibration error associated with each of the partitioned sets based in part on the one or more pairs.

* * * * *